(12) United States Patent
Masleid

(10) Patent No.: US 7,679,949 B1
(45) Date of Patent: Mar. 16, 2010

(54) COLUMN SELECT MULTIPLEXER CIRCUIT FOR A DOMINO RANDOM ACCESS MEMORY ARRAY

(76) Inventor: Robert Paul Masleid, 17266 Eaton La., Monte Sereno, CA (US) 95930

( * ) Notice: Subject to any disclaimer, the term of this patent is extended or adjusted under 35 U.S.C. 154(b) by 0 days.

(21) Appl. No.: 12/165,432

(22) Filed: Jun. 30, 2008

Related U.S. Application Data

(62) Division of application No. 11/273,897, filed on Nov. 14, 2005, now Pat. No. 7,394,681.

(51) Int. Cl.
*G11C 11/00* (2006.01)
(52) U.S. Cl. .................... 365/154; 365/189.02
(58) Field of Classification Search ................. 365/154, 365/189.02, 156, 230.05
See application file for complete search history.

(56) References Cited

U.S. PATENT DOCUMENTS

| | | |
|---|---|---|
| 3,991,380 A | 11/1976 | Pryor |
| 4,498,021 A | 2/1985 | Uya |
| 4,739,252 A | 4/1988 | Malaviya et al. |
| 5,128,560 A | 7/1992 | Chern et al. |
| 5,166,555 A | 11/1992 | Kano |
| 5,264,738 A | 11/1993 | Veendrick et al. |
| 5,297,086 A | 3/1994 | Nasu et al. |
| 5,410,278 A | 4/1995 | Itoh et al. |
| 5,414,312 A | 5/1995 | Wong |
| 5,416,861 A | 5/1995 | Koh et al. |
| 5,418,740 A | 5/1995 | Sasaki |
| 5,455,521 A | 10/1995 | Dobbelaere |
| 5,467,038 A | 11/1995 | Motley et al. |
| 5,497,105 A | 3/1996 | Oh et al. |
| 5,525,616 A | 6/1996 | Platt et al. |
| 5,568,103 A | 10/1996 | Nakashima et al. |
| 5,594,360 A | 1/1997 | Wojciechowski |
| 5,621,693 A * | 4/1997 | Nakase ...................... 365/227 |
| 5,677,650 A | 10/1997 | Kwasniewski et al. |
| 5,680,359 A | 10/1997 | Jeong |
| 5,698,774 A | 12/1997 | Osmanski |
| 5,698,994 A | 12/1997 | Tsuji |
| 5,739,715 A | 4/1998 | Rawson |
| 5,764,110 A | 6/1998 | Ishibashi |
| 5,767,700 A | 6/1998 | Lee |
| 5,791,715 A | 8/1998 | Nebel |
| 5,793,715 A | 8/1998 | Alon et al. |
| 5,796,313 A | 8/1998 | Eitan |
| 5,811,983 A | 9/1998 | Lundberg |

(Continued)

FOREIGN PATENT DOCUMENTS

EP 1398639 3/2004

(Continued)

OTHER PUBLICATIONS

Chen,G. et al, "Dynamic NBTI of p-MOS Transistors and its Impact on MOSFET Scaling", IEEE Electron Device Letters, 2002.

(Continued)

*Primary Examiner*—Anh Phung

(57) ABSTRACT

A column select multiplexer circuit for a domino random access memory array including a plurality of column selector circuits for selecting a column from a plurality of columns of static random access memory cells.

9 Claims, 6 Drawing Sheets

U.S. PATENT DOCUMENTS

| | | | |
|---|---|---|---|
| 5,880,608 A | 3/1999 | Mehta et al. | |
| 5,963,043 A | 10/1999 | Nassif | |
| 5,963,074 A | 10/1999 | Arkin | |
| 5,977,763 A | 11/1999 | Loughmiller et al. | |
| 5,982,211 A | 11/1999 | Ko | |
| 6,011,403 A | 1/2000 | Gillette | |
| 6,025,738 A | 2/2000 | Masleid | |
| 6,028,490 A | 2/2000 | Komatsu | |
| 6,031,403 A | 2/2000 | Gersbach | |
| 6,078,513 A | 6/2000 | Ong et al. | |
| 6,087,886 A | 7/2000 | Ko | |
| 6,114,840 A | 9/2000 | Farrell et al. | |
| 6,127,872 A | 10/2000 | Kumata | |
| 6,154,099 A | 11/2000 | Suzuki et al. | |
| 6,154,100 A | 11/2000 | Okamoto | |
| 6,172,545 B1 | 1/2001 | Ishii | |
| 6,172,943 B1 | 1/2001 | Yuzuki | |
| 6,188,260 B1 | 2/2001 | Stotz et al. | |
| 6,204,710 B1 | 3/2001 | Goetting et al. | |
| 6,229,747 B1 | 5/2001 | Cho et al. | |
| 6,238,522 B1 | 5/2001 | Graf | |
| 6,242,936 B1 | 6/2001 | Ho et al. | |
| 6,242,937 B1 | 6/2001 | Lee et al. | |
| 6,262,601 B1 | 7/2001 | Choe et al. | |
| 6,281,706 B1 | 8/2001 | Wert et al. | |
| 6,321,282 B1 | 11/2001 | Horowitz et al. | |
| 6,378,102 B1 * | 4/2002 | Watanabe et al. | 714/763 |
| 6,400,230 B2 | 6/2002 | Fairbanks et al. | |
| 6,407,571 B1 | 6/2002 | Furuya et al. | |
| 6,426,641 B1 | 7/2002 | Koch et al. | |
| 6,455,901 B2 | 9/2002 | Kameyama et al. | |
| 6,476,632 B1 | 11/2002 | La Rosa et al. | |
| 6,489,796 B2 | 12/2002 | Tomishima | |
| 6,535,014 B2 | 3/2003 | Chetlur et al. | |
| 6,538,471 B1 | 3/2003 | Stan et al. | |
| 6,538,522 B1 | 3/2003 | Aipperspach et al. | |
| 6,538,957 B2 | 3/2003 | Magoshi et al. | |
| 6,545,519 B1 | 4/2003 | Carballo | |
| 6,570,407 B1 | 5/2003 | Sugisawa | |
| 6,573,777 B2 | 6/2003 | Saint-Laurent et al. | |
| 6,577,157 B1 | 6/2003 | Cheung et al. | |
| 6,577,176 B1 | 6/2003 | Masleid et al. | |
| 6,621,318 B1 | 9/2003 | Burr | |
| 6,657,504 B1 | 12/2003 | Deal et al. | |
| 6,664,837 B1 | 12/2003 | Oh et al. | |
| 6,690,242 B2 | 2/2004 | Fang et al. | |
| 6,696,863 B2 | 2/2004 | Yamamoto et al. | |
| 6,697,929 B2 | 2/2004 | Cherkauer et al. | |
| 6,724,214 B2 | 4/2004 | Manna et al. | |
| 6,731,140 B2 | 5/2004 | Masleid et al. | |
| 6,731,179 B2 | 5/2004 | Abadeer et al. | |
| 6,759,863 B2 | 7/2004 | Moore | |
| 6,762,966 B1 | 7/2004 | La Rosa et al. | |
| 6,774,734 B2 | 8/2004 | Christensen et al. | |
| 6,798,230 B1 | 9/2004 | Taylor et al. | |
| 6,815,971 B2 | 11/2004 | Wang et al. | |
| 6,815,977 B2 | 11/2004 | Sabbavarapu et al. | |
| 6,831,494 B1 | 12/2004 | Fu et al. | |
| 6,876,571 B1 * | 4/2005 | Khellah et al. | 365/154 |
| 6,882,172 B1 | 4/2005 | Suzuki et al. | |
| 6,885,210 B1 | 4/2005 | Suzuki | |
| 6,903,564 B1 | 6/2005 | Suzuki | |
| 7,164,596 B1 | 1/2007 | Deng et al. | |
| 7,336,103 B1 | 2/2008 | Masleid et al. | |
| 2001/0000426 A1 | 4/2001 | Sung et al. | |
| 2001/0028278 A1 | 10/2001 | Ooishi | |
| 2001/0030561 A1 | 10/2001 | Asano et al. | |
| 2001/0052623 A1 | 12/2001 | Kameyama et al. | |
| 2002/0056016 A1 | 5/2002 | Horowitz et al. | |
| 2002/0178415 A1 | 11/2002 | Saraf | |
| 2003/0057775 A1 | 3/2003 | Yamashita et al. | |
| 2003/0127241 A1 | 7/2003 | Russell et al. | |
| 2003/0160630 A1 | 8/2003 | Earle | |
| 2003/0231713 A1 | 12/2003 | Masleid et al. | |
| 2004/0044983 A1 | 3/2004 | Dillon et al. | |
| 2004/0104731 A1 | 6/2004 | Vollertsen | |
| 2004/0119501 A1 | 6/2004 | Sabbavarapu et al. | |
| 2004/0119503 A1 | 6/2004 | McCormick et al. | |
| 2004/0148111 A1 | 7/2004 | Gauthier et al. | |
| 2004/0257115 A1 | 12/2004 | Bertram et al. | |
| 2005/0184720 A1 | 8/2005 | Bernstein et al. | |
| 2005/0212547 A1 | 9/2005 | Suzuki | |
| 2005/0248368 A1 | 11/2005 | Bertram et al. | |
| 2007/0136707 A1 | 6/2007 | Teig et al. | |

FOREIGN PATENT DOCUMENTS

| | | |
|---|---|---|
| JP | 0308962 | 4/1991 |
| JP | 04091516 | 3/1992 |

OTHER PUBLICATIONS

Oner et al., "A compact Monitoring Circuit for Real-Time On-Chip Diagnosis of Hot-Carrier Induced Degradation", Microelectronic test structures, Proceedings, IEEE International Conference in Monterey, CA Mar. 17-20, 1997, pp. 72-76.

Peters, Laura, "NBTI: A Growing Threat to Device Reliability", Semiconductor International, Mar. 1, 2004, http://www.reed-electronics.com/semiconductor/atricle/CA386329?industryid=3033.

Reddy, V. et al., "Impact of NegativeBias Temperature Instability on Digital Circuit Reliability", 2002 IEEE International Reliability Physics Symposium Proceedings, Dallas, TX, Apr. 7-11, 2002.

Lima T., et al.; "Capacitance Coupling Immune, Transient Sensitive Accelerator for Resistive Interconnect Signals of Subquater Micron ULSI", IEEE Journal of Solid-State Circuits, IEEE Inc., New York, US, vol. 31, No. 4, Apr. 1996, pp. 531-536.

Nalamalpu, et al., "Boosters for Driving Long Onchip Interconnects-Design Issues, Interconnect Synthesis, and Comparision With Repeaters", Jan. 2002, IEEE Transactions on Computer-Aided Design of Integrated Circuits and Systems, vol. 21, No. 1, Jan. 2002, pp. 50-62.

US 2003/0018946 A1, 10/2003, Abadeer et al (withdrawn)

\* cited by examiner

300

COLUMN SELECT MULTIPLEXER CIRCUIT FOR A DOMINO RANDOM ACCESS MEMORY ARRAY

RELATED CASE

This is a Divisional Application of, and claims priority to commonly owned U.S. patent application Ser. No. 11/273,897, filed Nov. 14, 2005, now U.S. Pat. No. 7,394,681, which is incorporated herein by reference in its entirety.

TECHNICAL FIELD

Embodiments of the present invention relate to random access memories in microprocessor applications. More particularly, embodiments of the present invention relate to a static random access memory with column select.

BACKGROUND ART

Conventional static random access memory (SRAM) arrays include a differential sense amplifier for determining the resulting voltage difference between a bitline and bitline bar of a column of SRAMs. However, the differential sense amplifier is sensitive to process variations especially as the speed of accessing the SRAMs memory array increases. As a result, high speed embedded SRAMs in current processors are not keeping pace with processor speeds in general. As such, as processor designs increase in scalability, the speed of the embedded cache SRAMs negatively limit the overall speed of the processor.

DISCLOSURE OF THE INVENTION

A column select multiplexer circuit for a domino random access memory array including a plurality of column selector circuits for selecting a column from a plurality of columns of static random access memory cells.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODES FOR CARRYING OUT THE INVENTION

Reference will now be made in detail to the preferred embodiments of the present invention, a domino SRAM memory array with column select, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, embodiments of the present invention provide a system for a domino SRAM memory array with column select. Embodiments of the present invention are capable of skewed static or dynamic logic decode of the SRAM memory array. Furthermore, embodiments of the present invention are capable of supporting a single bitline read, a simultaneous single bit-line read of the complement by reading the other bit-line, and a dual bitline write. The embodiments of the present invention improve SRAM density since the support circuits for implementing column select can be amortized over more than one column. In addition, in embodiments of the present invention the domino read of the SRAM memory array eliminates problems with the differential sense amplifier design.

Figure 1:
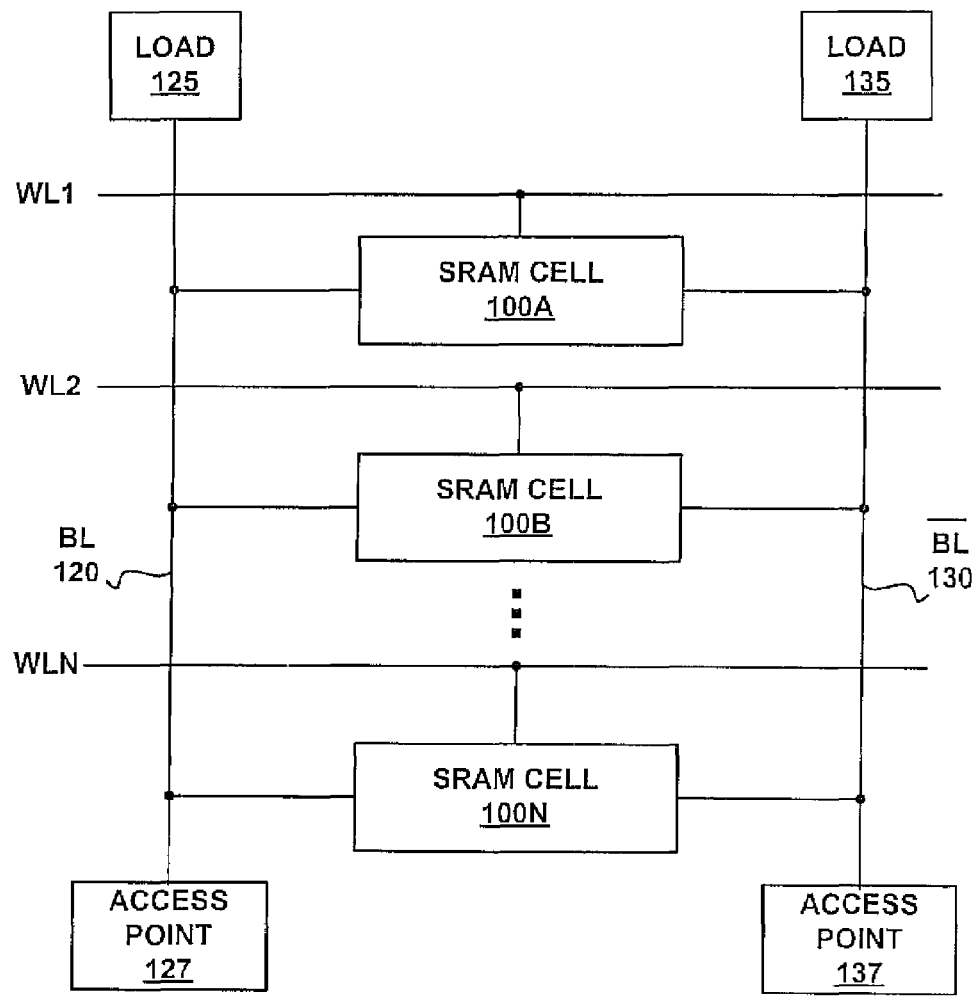
FIG. 1 is a diagram of a column of SRAM cells in a SRAM memory array, in accordance with one embodiment of the present invention.

Referring now to FIG. 1, one column 100 of an SRAM memory array is shown, in accordance with one embodiment of the present invention. The SRAM column 100 is one of a plurality of columns in the SRAM memory array and is selectable through the column select multiplexer circuits of the present invention, as will be described below.

The SRAM column 100 includes N static SRAM cells, including SRAM cells 110A, 110B, . . . 110N. Each of the SRAM cells in the SRAM column 100 are coupled to a bitline 120 and a bitline bar 130. Specifically, one side of the SRAM cell is coupled to the bitline 120, and the other side of the SRAM cell is coupled to the bitline bar 130.

The bitline 120 is coupled to a load 125. The load 125 helps establish a direct voltage (dc) on the bitline 120 when no SRAM cell is selected in the SRAM column 100. The bitline bar 130 is coupled to a load 135. The load 135 helps establish a dc voltage on the bitline bar 130 when no SRAM cell is selected in the SRAM column 100.

In addition, the bitline 120 is coupled to an access point 127. The bitline bar 130 is coupled to an access point 137. Each of the access points may comprise transistors that turn on when the SRAM column 100 is selected for reading from or writing to a particular SRAM cell in the SRAM column 100.

Additional components are coupled to the access points 127 and 137 to facilitate the read and write access of SRAM cells in the SRAM column 100. For example, in one embodiment of the present invention, sense amplifiers used in conventional techniques for sensing the voltage difference between bitline 120 and bitline bar 130 are replaced with domino circuitry traditionally used in logic circuits to create a domino SRAM. For instance, one type of circuit used to make logic circuits, such as those comprising processor logic, are referred to as dynamic circuits. Dynamic circuits are referred to as domino circuits in the present application. The domino circuit typically includes dynamic nodes that are coupled to logic circuits. For instance, in one embodiment, during a precharge cycle, the dynamic node is precharged with a voltage, and during an evaluation cycle, the logic circuits discharge the dynamic node for evaluation. Domino circuits have not typically been used in memory circuits.

Additionally, each of the SRAM cells are coupled to a word line. For instance, the SRAM cell 110A is coupled to the word line WL1, SPAM cell 110B is coupled to word line WL2, ..., and SRAM cell 110N is coupled to word line WLN. Read and write access to a particular SRAM cell in the SRAM column 100 is implemented by applying the appropriate voltage to the corresponding word line. For instance, to select SRAM cell 110, the WL1 is activated and either or both of the access points 127 and 137 are activated.

Also, each of the word lines are coupled to individual SRAM cells in parallel columns of SRAM cells. The parallel columns of SRAM cells are configured in an SRAM memory array. As a result, selecting a particular SRAM cell involves applying the appropriate voltage to the corresponding word line and then activating the appropriate access points corresponding to the selected column.

Figure 2:
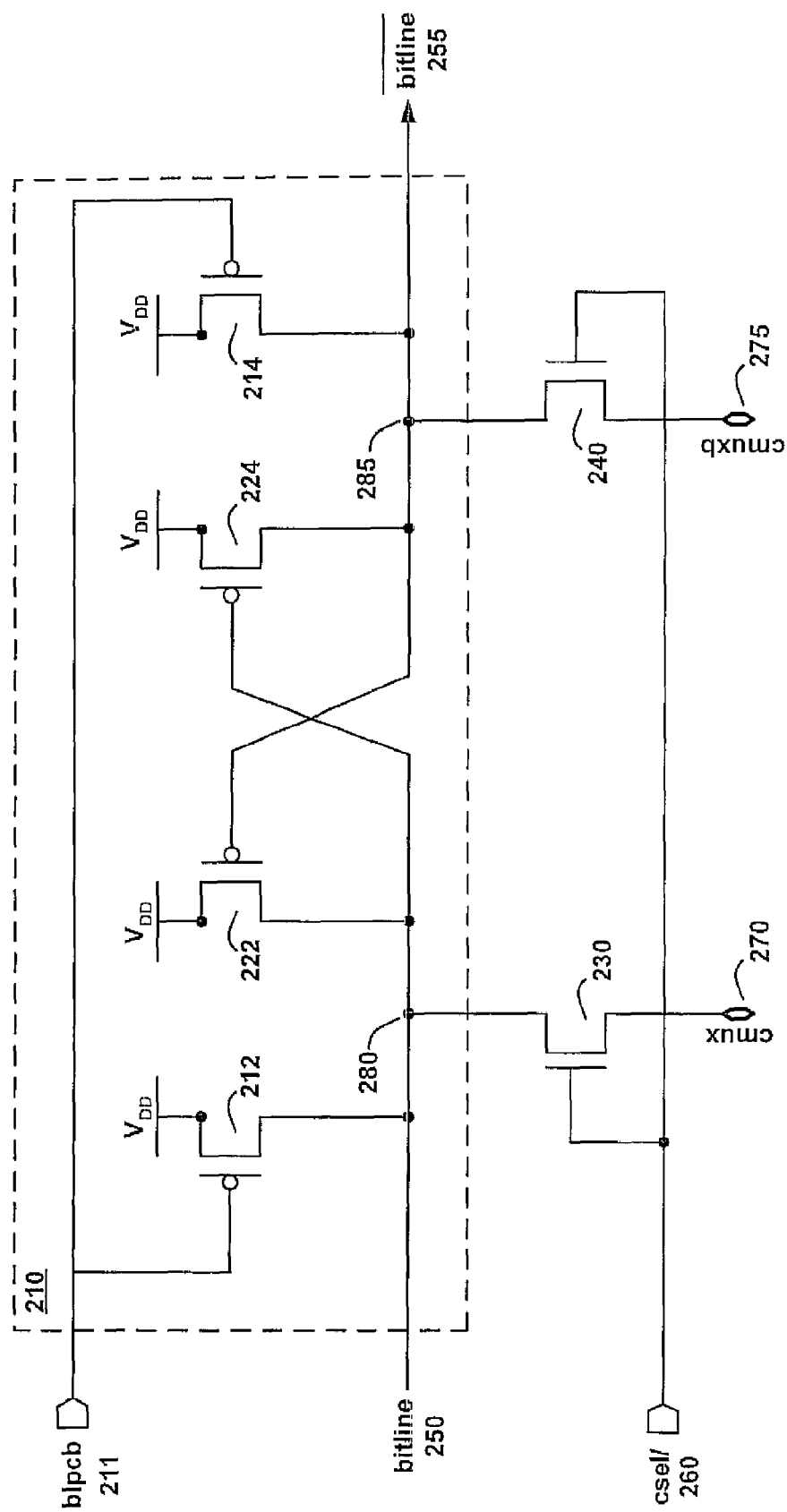
FIG. 2 is a diagram of a column selector for selecting a column of SRAM cells from a plurality of column of SRAM cells in an SRAM memory array, in accordance with one embodiment of the present invention.

FIG. 2 is a schematic diagram of a column selector 200 in a column select multiplexer circuit for a domino RAM array, in accordance with one embodiment of the present invention. The column selector 200 is capable of selecting a column of SRAM cells in an SRAM memory array.

In one embodiment, the column selector 200 is combined with a number of identical column selector 200s to form a column multiplexer that is capable of selecting a particular column of SRAM cells from a plurality of SRAM cells, in one embodiment of the present invention.

Specifically, in one embodiment, the number of columns supported by the column multiplexer is eight. This allows improved SRAM density by amortizing support circuits over more columns of SRAM cells. That is, instead of having separate read/write access circuitry for each of the columns, the use of the column multiplexer provides for a single read/write access circuit for all of the columns supported by the column select multiplexer. In addition, each of the column selectors is configured for a domino read in the corresponding column of SRAM cells.

The column multiplexer includes a plurality of column selector circuits for selecting a plurality of columns of SEAM cells. That is, the column multiplexer is capable of selecting one column of SRAM cells from the plurality of columns of SRAM cells for read/write access. Specifically, each of the column selector circuits provides selection for a corresponding column of SRAM cells for read/write access.

As shown in FIG. 2, an exemplary column selector 200 is shown and includes a bitline precharge circuit 210. The bitline precharge circuit 210 precharges the bitline 250 and the bitline bar 255, both of which are coupled to a corresponding column of SRAM cells. The precharge circuit 210 is coupled to the bitline 250 and the bitline bar 255.

The bitline precharge circuit 210 includes a first transistor 212 that is coupled to the bitline 250. In one embodiment, the first transistor is a p-type (e.g., p-channel) field effect transistor (PFET). The drain of the first transistor is coupled to the bitline 250, the source is coupled to the voltage, Vdd, and the gate is coupled to a bitline precharge line 211 that conveys the appropriate voltage for precharging the bitline 250 and bitline bar 255.

The bitline precharge circuit 210 includes a second transistor 214 that is coupled to the bitline bar 255. In one embodiment, the second transistor is a PFET. As shown in FIG. 2, the drain of the second transistor is coupled to the bitline bar 255, the source is coupled to Vdd, and the gate is coupled to the bitline precharge line 211 for precharging the bitline bar 255.

Also, the bitline precharge circuit 210 includes a third transistor 222 that is cross-coupled to a fourth transistor 224. For instance, the gate of the third transistor 222 is coupled through node 285 to the drain of the fourth transistor 224. Conversely, the gate of the fourth transistor 224 is coupled through node 280 to the drain of the third transistor 222. In addition, the third transistor 222 and the fourth transistor 224 are coupled between the first transistor 212 and the second transistor 214.

The column selector 200 also includes a first access transistor 230 coupled to the bitline 250. When activated by the appropriate voltage on the column select line 260, the first access transistor 230 provides read/write access to the bitline 250 of the corresponding column of SRAM cells. That is, the first access transistor provides read/write access to the bitline 250. In one embodiment, the first access transistor is a n-type (e.g., n-channel) field effect transistor (NFET).

As shown in FIG. 2, the first access transistor 230 has a gate coupled to the column select line 260, a source coupled to the bitline 250 through a node 280, and a drain coupled to the column multiplexer line through a column read/write access node 270 for providing access to the bitline 250.

The column selector 200 also includes a second access transistor 240 coupled to the bitline bar 255. When activated by the appropriate voltage on the column select line 260, the second access transistor 240 provides read/write access to the bitline bar 255 of the corresponding column of SRAM cells. That is, the second access transistor 240 provides read/write access to the bitline bar 255. In one embodiment, the second access transistor is an NFET.

As shown in FIG. 2, the second access transistor has a gate coupled to the column select line 260, a source coupled to the bitline bar 255 through a node 285, and a drain coupled to the column multiplexer bar line through a column read/write access node 275 for providing access to the bitline bar 255.

As shown in FIG. 2, the column select line 260 is coupled to the first access transistor 230 and the second access transistor 240 that when activated is used to select a corresponding column of SRAM cells from a plurality of columns of SRAM cells. The column of SRAM cells is selected for read/write access to a particular SRAM cell in the column. Each of the columns of SRAM cells is selectable by a corresponding column selector in the column select multiplexer circuit.

Figure 3:
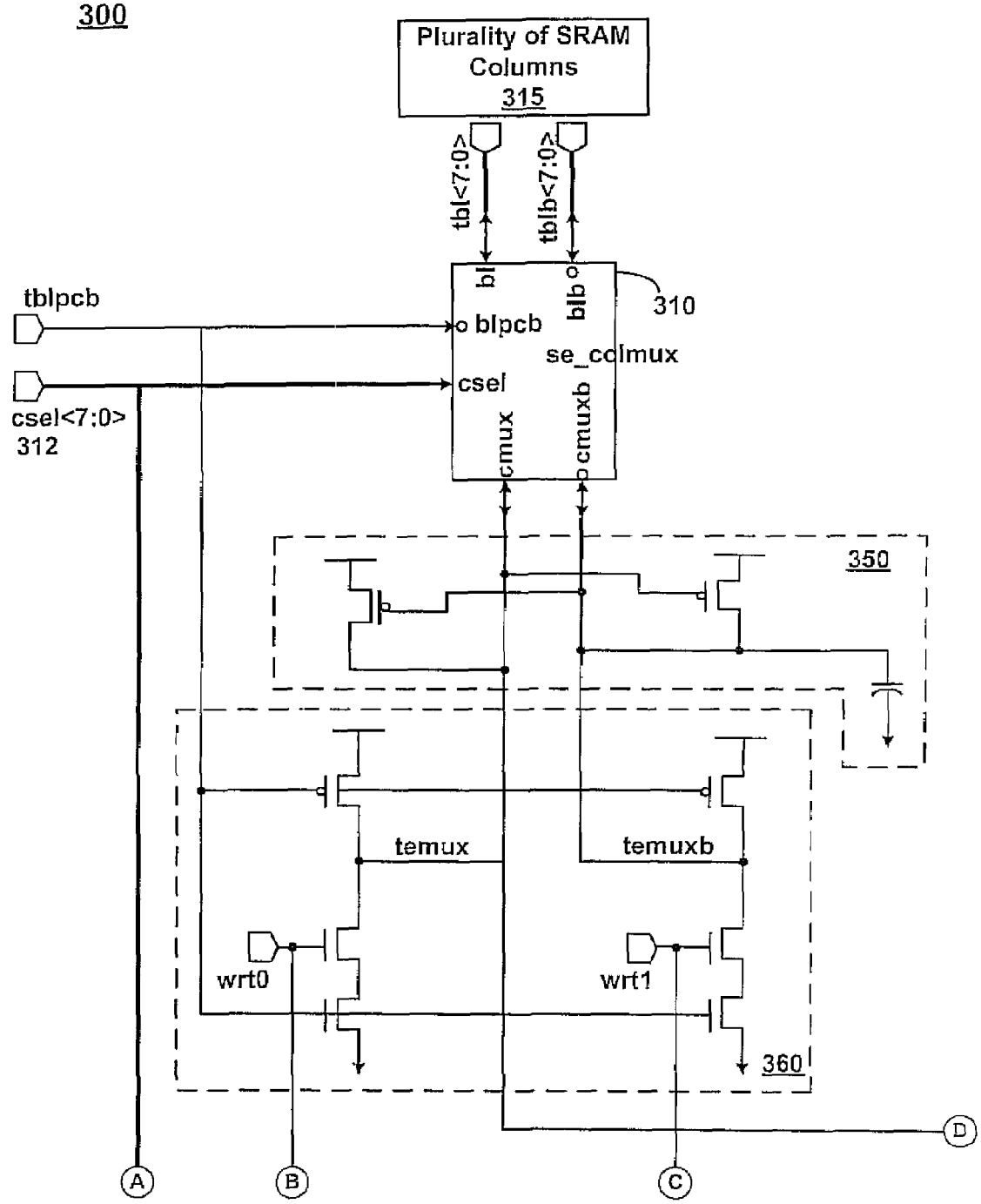
FIG. 3 is a schematic diagram of a column select multiplexer for selecting a column of SRAM cells from a plurality of column of SRAM cells in an SRAM memory array, in accordance with one embodiment of the present invention.
Figure 3:
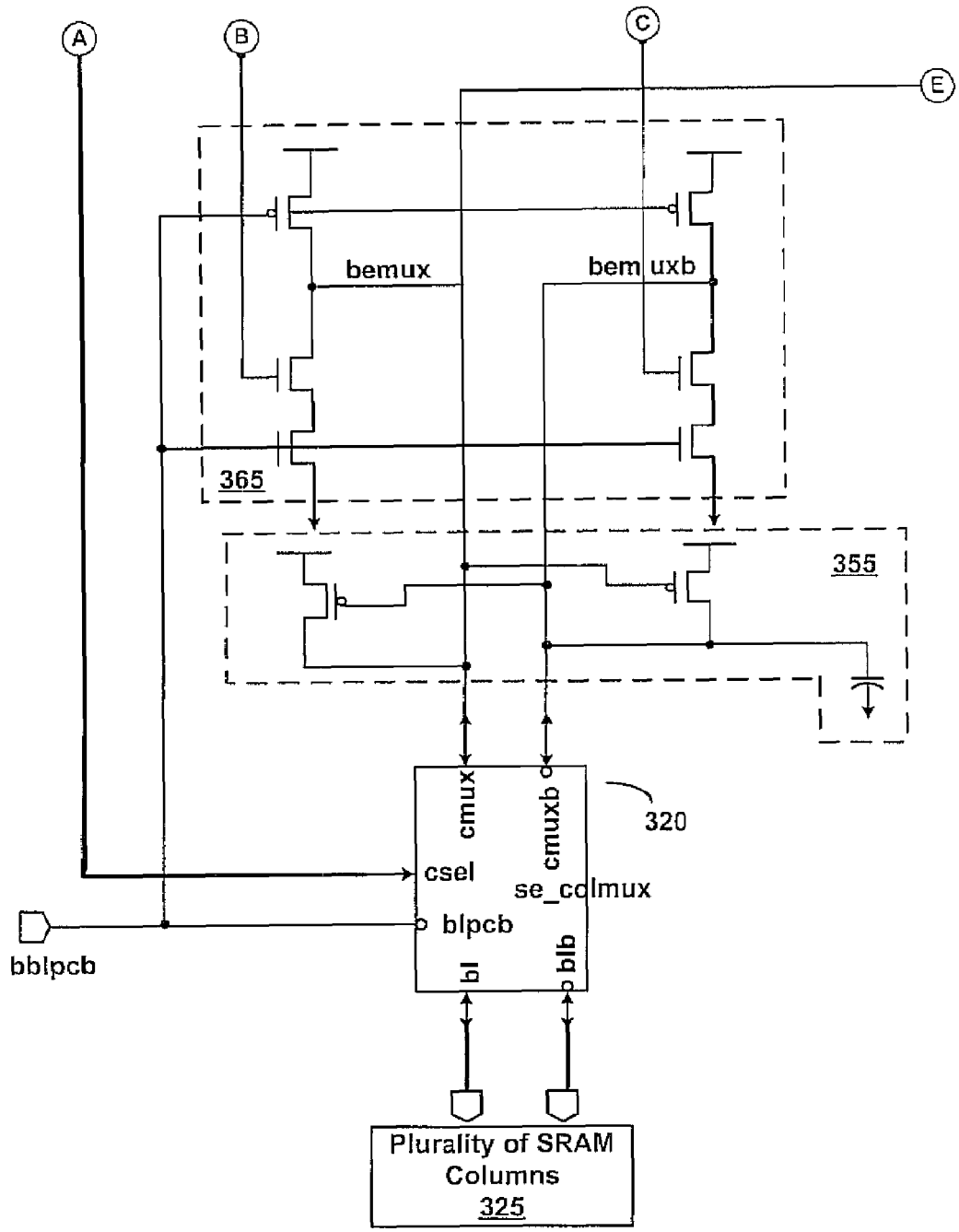
Figure 3:
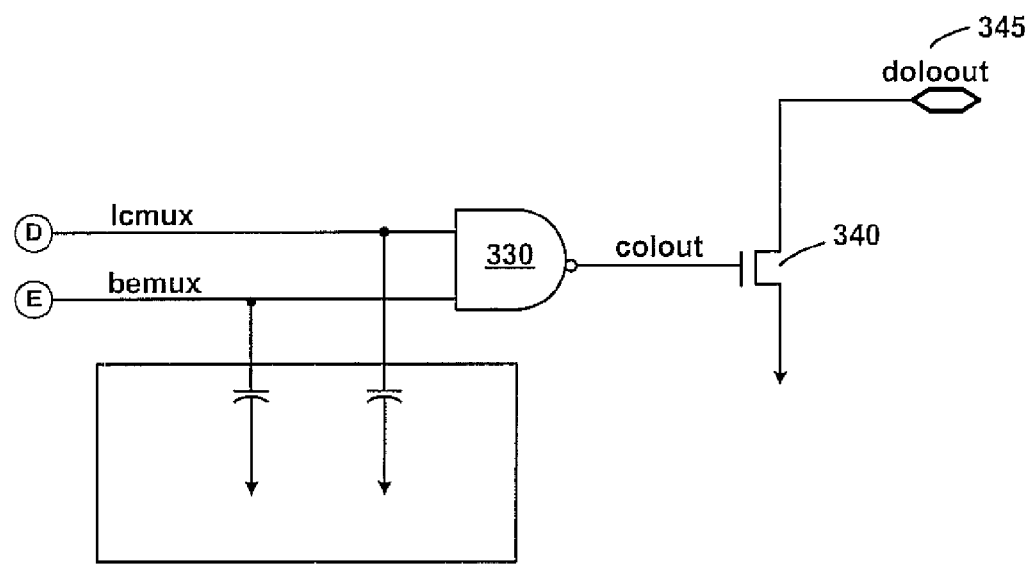

FIG. 3 is diagram of a column select multiplexer circuit 300 for selecting a column of SRAM cells from a plurality of column of SRAM cells in an SRAM memory array, in accordance with one embodiment of the present invention. The multiplexer circuit 300 improves SRAM cell density in an SRAM memory array through the use of the column selector.

As shown in FIG. 3, the multiplexer circuit 300 is configured in a compound domino structure for a domino read of data outputs from a plurality of SRAM cells in an SRAM memory array. The multiplexer circuit includes a first column select multiplexer 310 capable of accessing a first plurality 315 of columns of SRAM cells, a second column select multiplexer 320 capable of accessing a second plurality 325 of columns of SRAM cells, and a NAND logic gate 330.

The first column select multiplexer 310 is responsive to a first plurality of column select signals 312 for selecting a first column of SRAM cells from the first plurality 315 of columns of SRAM cells. The column select signals 312 are configured to select and activate one of the column select lines (e.g., column select line 260) for accessing the bitline and bitline bar of the corresponding column of SRAM cells in the first plurality of 315 of columns of SRAM cells.

In one embodiment, the first column select multiplexer 310 includes one or more of the column selectors 200 of FIG. 2, wherein each of the column selectors 200 activate a corresponding column of SRAM cells in the first plurality 315 of columns of SRAM cells. In this configuration, the bitline and bitline bar precharge circuit is located in respective column selectors in the column select multiplexer 300.

The second column select multiplexer 320 is responsive to a second of a plurality of column select signals (e.g., signal 312) for selecting a second column of SRAM cells from the second plurality 325 of columns of SRAM cells. The column select signals 312 is configured to select and activate one of the column select lines (e.g., column select line 260) for accessing the bitline and bitline bar of the corresponding column of SRAM cells in the second plurality of 325 columns of SRAM cells.

In one embodiment, the second column select multiplexer 320 includes one or more of the column selectors 200 of FIG. 2, wherein each of the column selectors 200 activates a corresponding column of SRAM cells in the second plurality 325 of columns of SRAM cells. In this configuration, the bitline and bitline bar precharge circuit is located in respective column selectors in the column select multiplexer 300.

The column select multiplexer 300 also includes a NAND logic gate 330. Inputs to the NAND logic gate include a first data output from the first column select multiplexer 310 and a second data output from the second column select multiplexer 320. The NAND logic gate 330 passes a data out signal from a selected SRAM cell in the first or second plurality of columns of SRAMs.

The NAND logic gate 330 is able to subdivide the capacitances of the dynamic nodes associated with each of the multiplexer circuits 310 and 320. Subdividing the capacitance is desirable since the current drive from the selected SRAM is limited. More specifically, the first column select multiplexer 310 and the second column select multiplexer 320 are configured between the first plurality 315 of columns of SRAM cells and the second plurality 325 of columns of SRAM cells in order to subdivide a capacitance associated with the column select multiplexer circuit. In addition, the switching point of the NAND logic gate is shifted in an advantageous direction, providing for a faster circuit.

In still another embodiment, the column select multiplexer 320 includes an NFET 340 for passing a data out signal 345 from one of the SRAM cells in the first plurality 310 or second plurality 320 of columns of SRAM cells through the NAND logic gate 330.

The column select multiplexer circuit of FIG. 3 also includes noise suppression circuits 350 and 355. The noise suppression circuit 350 includes a cross-coupled pair of PFETS, in one embodiment, for suppressing signal noise in the multiplexer circuit 310. The noise suppression circuit 350 is coupled to the read/write access nodes (e.g., nodes 270 and 275) for accessing the bitlines of the columns of SRAM cells in the first plurality 315 of SRAM cells. The noise suppression circuit 355 includes a cross-coupled pair of PFETs for suppressing signal noise in the multiplexer circuit 320. The noise suppression circuit 355 is coupled to the read/write access nodes (e.g., nodes 270 and 275) for accessing the bitlines of the columns of SRAM cells in the second plurality 325 of SRAM cells.

The column select multiplexer circuit 300 also includes a first write circuit 360. The first write circuit 360 is coupled to the first column select multiplexer 310 for writing to a first selected SRAM cell in a selected column of SRAMs from the first plurality 315 of columns of SRAM cells. In addition, the column select multiplexer circuit 300 also includes a second write circuit 365 coupled to the second column select multiplexer 320 for writing to a selected SRAM cell in a selected column of SRAM cells of the second plurality of columns of SPAM cells 325.

The column select multiplexer 300 of FIG. 3 is capable of reading the true and complement out of each of the SRAM cells in the plurality of columns of SRAM cells, in one embodiment. As a result, in one embodiment, simultaneous read of the true and complement facilitates XOR logic for implementing match functions.

In one embodiment, the bitlines and bitline bars in the columns of SRAM cells in each of the first plurality of SRAM columns 315 and second plurality of SRAM columns 325 have low bit counts. For example, in one embodiment, there are 16 bits or SRAM cells per bitline or bitline bar. In another embodiment, there are 32 bits or SRAM cells per bitline or bitline bar. The low bits per bitline decreases SRAM sensitivity to SRAM cell behavior.

Figure 4:
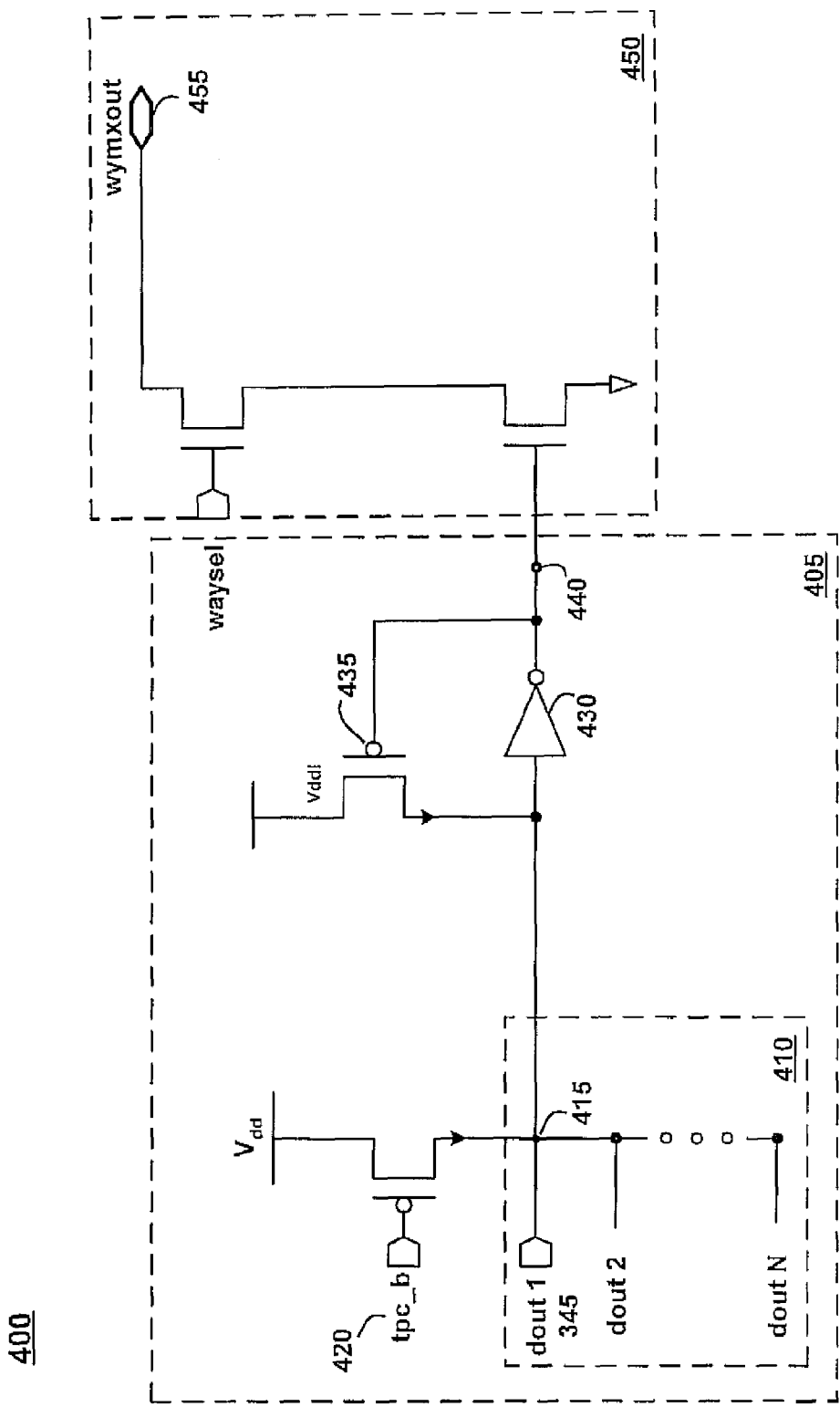
FIG. 4 is a schematic diagram illustrating the output from a plurality of column select multiplexers, in accordance with one embodiment of the present invention.

FIG. 4 is a schematic diagram 400 of a multiplexer 405 illustrating the output from a plurality of column select multiplexers, in accordance with one embodiment of the present invention. The multiplexer 400 takes as an input, data out signals from a plurality of column select multiplexer circuits, and provides an output signal for the SRAM memory array at the node 440. In this way, multiple duplications of SRAM memory blocks each of which are supported by a column selector multiplexer circuit as illustrated in FIG. 3 can be configured to form an SRAM memory array. As such, the multiplexer 400 is able to output a data out signal at node 440 from the SRAM memory array.

The multiplexer circuit 400 includes a data input block 410, a precharge circuit 420, a half latch keeper 435, and output buffer 430.

In particular, the multiplexer 400 takes the outputs from a plurality of column select multiplexer circuits, wherein each of the plurality of column select multiplexer circuits comprises a compound domino structure for a domino read of data outputs from a plurality of SRAM cells in an SRAM memory array, as is illustrated in FIG. 3, in accordance with one embodiment of the present invention.

As shown in FIG. 4, at the input block 410, the dataout signals provided as inputs are dout1 (e.g., dataout signal 345 of FIG. 3), dout2, . . . , doutN. The input block 410 produces a distributed domino circuit and acts effectively as an OR gate. That is, if any of the inputs provide an input signal to the input block 410, the node 415 discharges, effectively passing the signal on through the multiplexer 400.

As shown in FIG. 4, additional logic can be coupled to the output node 440. For example, the way select circuit 450 is coupled to the output node 440 and produces a way selected signal at node 455.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

Accordingly, embodiments of the present invention provide a system for a domino SRAM memory array with column select. Embodiments of the present invention are capable of skewed static or dynamic logic decode of the SRAM memory array. Furthermore, embodiments of the present invention are capable of supporting a single bitline read, a simultaneous single bit-line read of the complement by reading the other bit-line, and a dual bitline write. The embodiments of the present invention improve SRAM density since the support circuits for implementing column select can be amortized over more than one column. In addition, in embodiments of the present invention the domino read of the SRAM memory array eliminates problems with the differential sense amplifier design.

Embodiments of the present invention, a domino SRAM memory array with column select have been described. While the present invention has been described in particular embodiments, it should be appreciated that the present invention should not be construed as limited by such embodiments, but rather construed according to the below claims.

What is claimed is:

1. A column select multiplexer circuit for a domino random access memory array, comprising:
   a plurality of column selector circuits for selecting a plurality of columns of static random access memory cells (SRAM cells), wherein each of said plurality of column selector circuits comprises:
      a bitline precharge circuit for precharging a bitline and a bitline bar of a corresponding column of static random access memory cells (SRAM cells), said bitline precharge circuit coupled to said bitline and said bitline bar;
      a first access n-type field effect transistor (NFET) coupled to said bitline and to a first node for accessing said bitline;
      a second access NFET coupled to said bitline bar and to a second node for accessing said bitline bar;
      a column select line coupled to said first and second access transistors that when activated selects said column of SRAM cells for reading and writing of a selected SRAM cell in said corresponding column of SRAM cells.

2. The column select multiplexer circuit of claim 1, wherein said bitline precharge circuit comprises:
   a first p-type field effect transistor (PFET) cross-coupled to a second PFET through a first node coupled to said bitline and through second node coupled to said bitline bar;
   a third PFET coupled to said bitline through said first node that when activated by a precharge signal precharges said bitline;
   a fourth PFET coupled to said bitline bar through said second node that when activated by said precharge signal precharges said bitline bar.

3. The column select multiplexer circuit of claim 2, wherein said first access NFET comprises:
   a source coupled to said first node;
   a gate coupled to said column select line; and
   a drain coupled to a column read/write access node.

4. The column select multiplexer circuit of claim 2, wherein said second access NFET comprises:
   a source coupled to said second node;
   a gate coupled to said column select line; and
   a drain coupled to a column bar read/write access node.

5. The column select multiplexer circuit of claim 1, wherein said plurality of column selector circuits accesses at least eight columns of SRAM cells.

6. A column select multiplexer circuit for a domino random access memory array, comprising:
   a first transistor coupled to a bitline of a first column of static random access memory cells (SRAM cells) and to a bitline precharge line for precharging said bitline;
   a second transistor coupled to a bitline bar of said first column of SRAM cells and to said bitline precharge line for precharging said bitline bar;
   a third transistor cross-coupled to a fourth transistor and coupled between said first and second transistors;
   a first access transistor coupled to said bitline for read/write access of said bitline;
   a second access transistor coupled to said bitline bar for read/write access of said bitline bar; and
   a first column select line coupled to said first and second access transistors that when activated selects said first column of SRAM cells from a plurality of columns of SRAM cells each of which are selectable by said column select multiplexer circuit.

7. The column select multiplexer circuit of claim 6, wherein said first, second, third, and fourth transistors comprise a p-type field effect transistor (PFET).

8. The column select multiplexer circuit of claim 6, wherein said first access transistor and said second access transistor comprise a n-type field effect transistor (NFET).

9. The column select multiplexer circuit of claim 6, further comprising:
   a fourth transistor coupled to a bitline of a second column of SRAM cells and to said bitline precharge line for precharging said bitline of said second column of SRAM cells;
   a fifth transistor coupled to a bitline bar of said second column of SRAM cells and to said bitline precharge line for precharging said bitline bar of said second column of SRAM cells;
   a third access transistor coupled to said bitline for read/write access of said bitline of said second column of SRAM cells;
   a fourth access transistor coupled to said bitline bar for read/write access of said bitline bar of said second column of SRAM cells; and
   a second column select line coupled to said third and fourth access transistors that when activated selects said second column of SPAM cells from said plurality of columns of SRAM cells.

* * * * *